United States Patent
Akama

(10) Patent No.: US 7,298,211 B2
(45) Date of Patent: Nov. 20, 2007

(54) POWER AMPLIFYING APPARATUS

(75) Inventor: Hideo Akama, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 163 days.

(21) Appl. No.: 11/144,856

(22) Filed: Jun. 3, 2005

(65) Prior Publication Data

US 2005/0270102 A1 Dec. 8, 2005

(30) Foreign Application Priority Data

Jun. 4, 2004 (JP) ............................. 2004-167382

(51) Int. Cl.
*H03F 3/26* (2006.01)
(52) U.S. Cl. ................. 330/267; 330/261; 330/271
(58) Field of Classification Search ............... 330/255, 330/262, 267, 271
See application file for complete search history.

(56) References Cited

U.S. PATENT DOCUMENTS 5,229,721 A 7/1993 Stade .................... 330/265
5,467,058 A * 11/1995 Fujita ........................ 330/267
6,396,933 B1 * 5/2002 Jung et al. .............. 330/207 A

FOREIGN PATENT DOCUMENTS

| GB | 2 073 524 | 10/1981 |
| JP | 08-097645 | 4/1996 |
| JP | 2003-060451 | 2/2003 |

\* cited by examiner

*Primary Examiner*—Khanh Van Nguyen
(74) *Attorney, Agent, or Firm*—Ohlandt, Greeley, Ruggiero & Perle L.L.P.

(57) ABSTRACT

A push-pull amplifier includes a pair of transistors, wherein each of the transistors has a control terminal, a first terminal, and a second terminal. A current that flows between the first terminal and the second terminal is controlled in accordance with signals applied to the control terminal, such that when an amount of current flowing between the first terminal and the second terminal of one of the transistors is within a predetermined range, a high-frequency component of the signals input to the control terminal of one of the transistors is amplified, and when this current is outside the predetermined range, the high frequency component is not amplified.

8 Claims, 4 Drawing Sheets

PRIOR ART

POWER AMPLIFYING APPARATUS

FIELD OF THE INVENTION

The present invention pertains to a power amplifying apparatus and relates in particular to a power amplifying apparatus comprising a push-pull amplifier.

DISCUSSION OF THE BACKGROUND ART

A push-pull amplifier is a typical power amplifying means. A push-pull amplifier is an amplifier made from a pair of transistors and is such that the output from each of the transistors in the pair is synthesized to obtain a signal output (for instance, refer to JP (Kokai) 2003-060,451 (pages 4 and 5, FIG. 1)).

A circuit diagram of a typical power amplifying apparatus comprising a push-pull amplifier is shown in FIG. 1. A power amplifying apparatus 10 in FIG. 1 comprises an input terminal X1, an operational amplifier A11, a push-pull amplifier 100, and an output terminal Y1. Input terminal X1 is connected to the inverting input of operational amplifier A11. The output signals of operational amplifier A11 are input to a push-pull amplifier 100. The output signals of push pull amplifier 100 are applied to output terminal Y1 and to the non-inverting input of operational amplifier A11. It should be noted that a load Z is connected to output terminal Y1 in order to facilitate understanding of the description that follows. Moreover, load Z is a resistor.

Push-pull amplifier 100 is a bipolar push-pull amplifier that uses MOS-type field effect transistors. Push-pull amplifier 100 comprises an input terminal S1, an output terminal T1, a P channel MOS-type field effect transistor Q11, and an N channel MOS-type field effect transistor Q12. The source of field effect transistor Q11 is connected to a positive power source Vcc. The source of field effect transistor Q12 is connected to a negative power source Vee. The output signals of operational amplifier A11 are applied through a constant-voltage source E11 to the gate of field effect transistor Q11. Moreover, the output signals of operational amplifier A11 are applied through a constant-voltage source E12 to the gate of field effect transistor Q12. The drain of field effect transistor Q11 and the drain of field effect transistor Q12 are connected together. Moreover, these drains are connected to output terminal Y1. In short, push-pull amplifier 100 is a drain output-type push-pull amplifier that outputs signals that have been inverted with respect to signals received at S1. Constant-voltage source E11 and constant-voltage source E12 are used for bias. Push-pull amplifier 100 can be operated as a class A, class AB, or class B amplifier by adjusting the magnitude of the bias.

Moreover, operational amplifier A11 acts in such a way that there is no difference between the voltage at input terminal X1 and the voltage at output terminal Y1. As a result, power amplifying apparatus 10 power-amplifies signals input from input terminal X1 and outputs them from output terminal Y1.

The loop gain (dB) of power amplifying apparatus 10 is the sum of the amplification factor (dB) of operational amplifier A11 and the amplification factor (dB) of push-pull amplifier 100. In general, the amplification factor of operational amplifier A11 is set so that it decreases with an increase in frequency, while the amplification factor of push-pull amplifier 100 is set so that it is constant regardless of frequency. Moreover, the amplification factor of push-pull amplifier 100 decreases as the drain current of field effect transistor Q11 or Q12 becomes smaller. The reason for this is as follows.

The amplification factor GM of push-pull amplifier 100 is the sum of amplification factor gm1 of field effect transistor Q11 and amplification factor gm2 of field effect transistor Q12. The AC amplification factor of a field effect transistor is represented by mutual conductance gm. It should be noted that mutual conductance gm is also represented as forward transmission admittance $|Y_{fs}|$. The mutual conductance of a field effect transistor is virtually zero as long as the gate voltage is the threshold voltage or less. The drain current increases as gate voltage rises. As a result, mutual conductance gm increases. Therefore, it is assumed that push-pull amplifier 100 operates as a class AB amplifier. In general, the drain current of field effect transistor Q11 is large and the amplification factor gm1 of field effect transistor Q11 is also large when push-pull amplifier 100 outputs a large positive voltage. In this case, gm1 dominates the amplification factor GM; therefore, GM is large, as well as gm1. The drain current of field effect transistor Q11 decreases and gm1 also becomes smaller as the output voltage of push-pull amplifier 100 gradually decreases. The drain current of field effect transistor Q12 at this time is small and the amplification factor gm2 of field effect transistor Q12 is also small. There is a gradual increase in gm2 as the output voltage of push-pull amplifier 100 falls closer to zero. However, the amplification factor GM is quite small at this time. Thereafter, amplification factor gm2 of field effect transistor Q12 increases with a further reduction in the output voltage of push-pull amplifier 100. The amplification factor GM is now dominated by gm2 at this time; therefore, GM is large, as well as gm2. Similarly, the overall amplification factor GM changes dependent on the drain current of each field effect transistor and the output voltage of push-pull amplifier 100.

Power amplifying apparatus 10 has a finite frequency band; therefore, the frequency band of power amplifying apparatus 10 becomes narrower as the AC amplification factor of push-pull amplifier 100 decreases. Moreover, the frequency band of power amplifying apparatus 10 changes considerably as the change in the drain current of field effect transistor Q11 or Q12 becomes larger. Power amplifying apparatus 10 tends to vibrate and outputs an unwanted ringing waveshape as the amount of change in the frequency band increases. Furthermore, there is also a problem with this type of power amplifying apparatus 10 in that when there is high-speed change in the size of the load, it is difficult to maintain a constant output level.

The current amplification factor hfe of a bipolar transistor decreases with a reduction in the collector current. Consequently, the above-mentioned problem similarly occurs in a push-pull amplifier made from a pair of bipolar transistors and a push-pull amplifier made from a pair comprised of a bipolar transistor and a field effect transistor. Moreover, this problem becomes more obvious as the electrical efficiency of the push-pull amplifier improves. This is because the idle drain current and collector current are set at zero or at a relatively small value.

The present invention solves the above-mentioned problems, an object thereof being to provide a push-pull amplifier that prevents the reduction in the AC amplification factor that is attributed to changes in the collector current or the source current of the transistors. Moreover, an object of the present invention is to provide a power amplifying apparatus comprising this type of push-pull amplifier.

SUMMARY OF THE INVENTION

The present invention provides that the amplification factor in the high-frequency band of a push-pull amplifier made of a pair comprised of a push-side transistor and a pull-side transistor is compensated when the collector current or source current of the transistor on the push side or of the transistor on the pull side is within a predetermined range. In order to compensate the amplification factor, the push-pull amplifier of the present invention manipulates signals applied to the base or the gate of the transistor on the push side or of the transistor on the pull side, or directly supplements output signals.

The present invention provides for a push-pull amplifier. The push-pull amplifier includes a pair of transistors, wherein each of the transistors has a control terminal, a first terminal, and a second terminal. A current that flows between the first terminal and the second terminal is controlled in accordance with signals applied to the control terminal, such that when an amount of current flowing between the first terminal and the second terminal of one of the transistors is within a predetermined range, a high-frequency component of the signals input to the control terminal of one of the transistors is amplified, and when this current is outside the predetermined range, the high frequency component is not amplified.

The present invention also provides for a push-pull amplifier having an input terminal, an output terminal, a pair of transistors, and an amplifier. The pair of transistors amplifies signals received at the input terminal, and output to the output terminal. Each of the transistors includes a control terminal, a first terminal, and a second terminal that controls a current flowing between the first terminal and the second terminal in accordance with signals applied to the control terminal. The amplifier is for amplifying only a high-frequency component extracted from the signals received at the input terminal, and outputting the amplified signal to the output terminal when an amount of current flowing between the first and second terminals of one of the transistors is within a predetermined range. The amplifier is turned off when the amount of current flowing is outside the predetermined range.

Another aspect of the present invention provides for a power amplifying apparatus. The power amplifying apparatus includes a push-pull amplifier having a pair of transistors, wherein each of the transistors has a control terminal, a first terminal, and a second terminal, and wherein a current that flows between the first terminal and the second terminal is controlled in accordance with signals applied to the control terminal, such that when an amount of current flowing between the first terminal and the second terminal of one of the transistors is within a predetermined range, a high-frequency component of signals input to the control terminal of one of the transistors is amplified. When this current is outside the predetermined range, the high-frequency component is not amplified.

Yet another aspect of the present invention provides for a power amplifying apparatus that includes a push-pull amplifier having an input terminal, an output terminal, a pair of transistors, and an amplifier. The pair of transistors amplifies signals received at the input terminal and output to the output terminal. Each of the transistors includes a first terminal, and a second terminal, and a control terminal that controls a current flowing between the first terminal and the second terminal in accordance with signals applied to the control terminal. The amplifier is for amplifying only a high-frequency component extracted from the signals received at the input terminal and outputting an amplified signal to the output terminal when an amount of current flowing between the first and second terminals of one of the transistors is within a predetermined range. The amplifier is turned off when the amount of current flowing is outside the predetermined range.

By means of the present invention, it is possible to control the changes in the AC amplification factor that are attributed to changes in the collector current or source current of one of the pair of transistors of a push-pull amplifier comprising at least one pair of transistors. Moreover, by means of the present invention, it is possible to control the reduction in the AC amplification factor when the collector current or the source current of one of a pair of transistors is small in a push-pull amplifier comprising at least one pair of transistors. As a result, a power amplifying apparatus that uses this type of push-pull amplifier can amplify with stability signals of a higher frequency than in the past.

DETAILED DESCRIPTION OF THE PREFERRED EMBODIMENT

Figure 1:
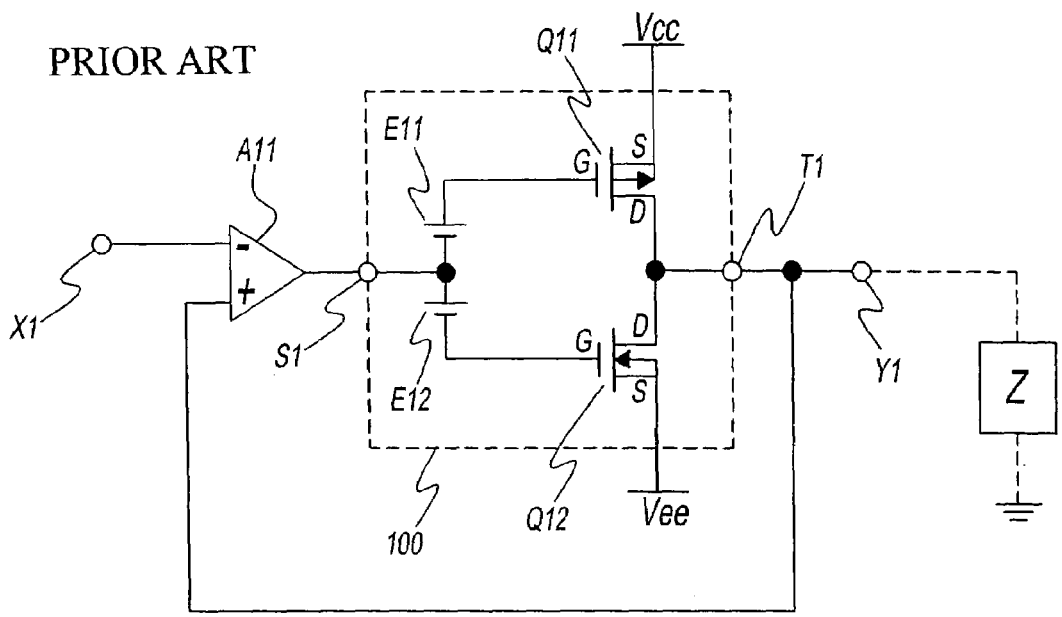
FIG. 1 is a drawing showing a power amplifying apparatus 10 comprising a conventional push-pull amplifier 100.
Figure 2:
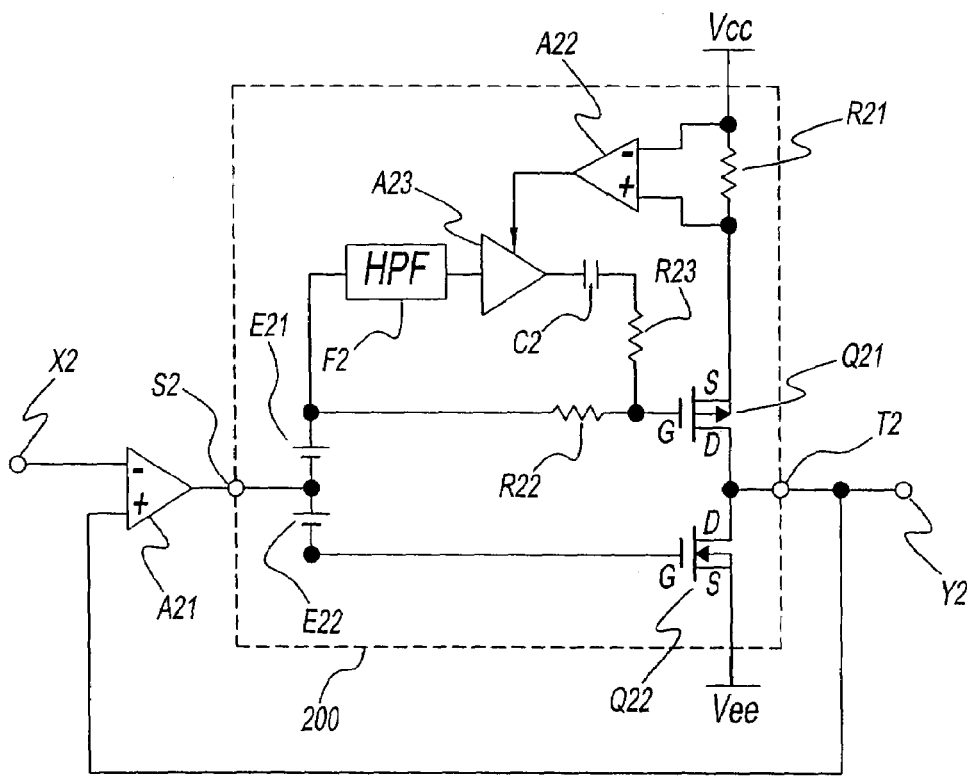
FIG. 2 is a drawing showing a power amplifying apparatus 20 comprising a push-pull amplifier 200 of the present invention.

The present invention will be explained in detail based on the embodiments shown in the attached drawings. By means of the present embodiment, the amplification factor of the push-pull amplifier is compensated by manipulating the signals input to the gate of the transistor on the push side. The first embodiment of the present invention is a power amplifying apparatus 20 shown in FIG. 2.

Power amplifying apparatus 20 in the figure comprises an input terminal X2, an output terminal Y2, an operational amplifier A21, and a push-pull amplifier 200. Signals at input terminal X2 and signals at output terminal Y2 are applied to operational amplifier A21. Operational amplifier A21 inputs to push-pull amplifier 200 signals such that the difference between the two signals to be input is zero. Push-pull amplifier 200 power-amplifies input signals and outputs the product to output terminal Y2.

Push-pull amplifier 200 is a bipolar push-pull amplifier that uses an MOS field effect transistor. Push-pull amplifier 200 comprises an input terminal S2, an output terminal T2, a push-side P channel MOS field effect transistor Q21, a pull-side N channel MOS field effect transistor Q22, a constant-voltage source E21, and a constant-voltage source E22. The drain of field effect transistor Q21 and the drain of field effect transistor Q22 are connected to output terminal T2. The source of field effect transistor Q21 is connected to a positive power source Vcc. The source of field effect transistor Q22 is connected to a negative power source Vee. Signals received at input terminal S2, that is, output signals of operational amplifier A21, are biased by constant-voltage source E21 and input to the gate of field effect transistor Q21. Moreover, signals received at input terminal S2 are biased by constant-voltage source E22 and input to the gate of field effect transistor Q22. The pair of field effect transistors Q21 and Q22 operates as a class A, class AB, or class B amplifier in accordance with the voltage of constant-voltage sources E21 and E22. The structure described above is the basic part of push-pull amplifier 200.

Furthermore, push-pull amplifier 200 comprises a resistor R21 and an operational amplifier A22. Resistor R21 is disposed between the source of field effect transistor Q21 and positive power source Vcc. Operational amplifier A22 detects the potential difference between the two terminals of resistor R21 and outputs signals that represent the amount of current flowing between the source and drain of field effect transistor Q21.

Push-pull amplifier 200 comprises a high-pass filter F2, an amplifier A23, a capacitor C2, a resistor R22, and a resistor R23. High-pass filter F2 extracts the high-frequency component of signals received at input terminal S2 and outputs the filtered product to amplifier A23. The cut-off frequency of high-pass filter F2 is set such that it includes the band that should be compensated. Amplifier A23 amplifies input signals by a predetermined amplitude and then outputs the amplified signal. Amplifier A23 operates in accordance with output signals of operational amplifier A22. In further detail, amplifier A23 outputs signals only when the amount of current flowing between the source and drain of field effect transistor Q21 is a predetermined value or less. Capacitor C2 is used in order to obtain the alternating current component from the output signals of amplifier A23. Resistors R22 and R23 operate as a signal adding means.

Consequently, only signals that have been biased by constant-voltage source E21 are applied at the gate of field effect transistor Q21 when the amount of current flowing between the source and the drain of field effect transistor Q21 is larger than a predetermined value. On the other hand, signals obtained by adding signals that have been biased by constant-voltage source E21 and output signals of amplifier A23 are applied at the gate of field effect transistor Q21 when the amount of current flowing between the source and drain of field effect transistor Q21 is a predetermined value or less. In short, if the amount of current flowing between the source and drain of field effect transistor Q21 is a predetermined value or less, the high-frequency component of signals input to the gate of field effect transistor Q21 are amplified in comparison to when the amount of current is greater than a predetermined value. The amplification factor of push-pull amplifier 200 is thereby compensated.

Figure 3:
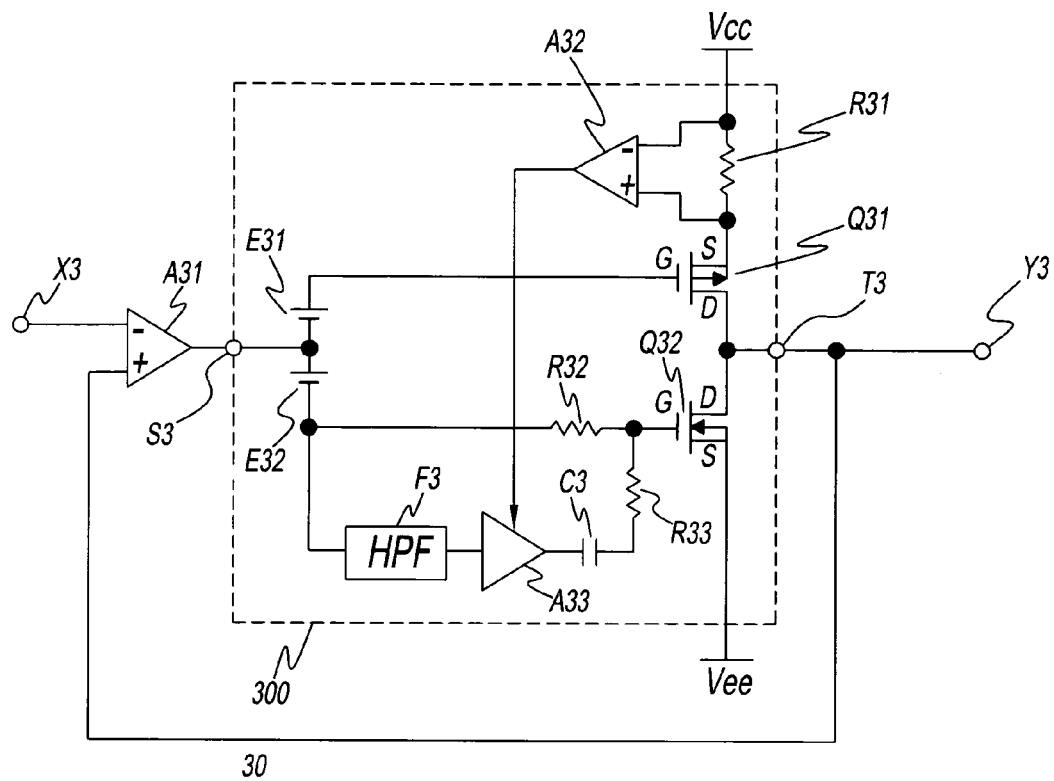
FIG. 3 is a drawing showing a power amplifying apparatus 30 comprising a push-pull amplifier 300 of the present invention.

Next, a second embodiment of the present invention will be described. By means of the present embodiment, signals input to the gate of the pull-side transistor are manipulated to compensate the amplification factor of the push-pull amplifier. FIG. 3 shows a power amplifying apparatus 30, the second embodiment of the present invention.

Power amplifying apparatus 30 in the figure comprises an input terminal X3, an output terminal Y3, an operational amplifier A31, and a push-pull amplifier 300. Signals at input terminal X3 and signals at output terminal Y3 are applied to operational amplifier A31. Operational amplifier A31 inputs to push-pull amplifier 300 signals such that the difference between two signals to be input is zero. Push-pull amplifier 300 power-amplifies input signals and outputs amplified signals to output terminal Y3.

Push-pull amplifier 300 is a bipolar push-pull amplifier that uses an MOS field effect transistor. Push-pull amplifier 300 comprises an input terminal S3, an output terminal T3, a push-side P channel MOS field effect transistor Q31, a pull-side N channel MOS field effect transistor Q32, a constant-voltage source E31, and a constant-voltage source E32. The drain of field effect transistor Q31 and the drain of field effect transistor Q32 are connected to output terminal T3. The source of field effect transistor Q31 is connected to a positive power source Vcc. The source of field transistor Q32 is connected to a negative power source Vee. Signals received at input terminal S3, that is, output signals of operational amplifier A31, are biased by constant-voltage source E31 and input to the gate of field effect transistor Q31. Moreover, signals received at input terminal S3 are biased by constant-voltage source E32 and input to the gate of field effect transistor Q32. The pair of field effect transistors Q31 and Q32 operates as a class A or class AB amplifier in accordance with the voltage of constant-voltage sources E31 and E32. The structure described above is the basic part of push-pull amplifier 300.

Furthermore, push-pull amplifier 300 comprises a resistor R31 and an operational amplifier A32. Resistor R31 is disposed between the source of field effect transistor Q31 and positive power source Vcc. Operational amplifier A32 detects the potential difference between the two terminals of resistor R31 and outputs signals that represent the amount of current flowing between the source and drain of field effect transistor Q31.

Push-pull amplifier 300 comprises a high-pass filter F3, an amplifier A33, a capacitor C3, a resistor R32, and a resistor R33. High-pass filter F3 extracts the high-frequency component of signals received at input terminal S3 and outputs the filtered signal to amplifier A33. The cut-off frequency of high-pass filter F3 is set such that it includes the band that should be compensated. Amplifier A33 amplifies input signals by a predetermined amplitude and then outputs an amplified signal. Amplifier A33 operates in accordance with the output signals of operational amplifier A32. In further detail, amplifier A33 outputs signals only when the amount of current flowing between the source and the drain of field effect transistor Q31 is a predetermined value or less. Capacitor C3 is used in order to obtain the alternating current component from the output signals of amplifier A33. Resistors R32 and R33 operate as a signal adding means.

Consequently, only signals that have been biased by constant-voltage source E32 are applied at the gate of field effect transistor Q32 when the amount of current flowing between the source and the drain of field effect transistor Q31 is greater than a predetermined value. On the other hand, signals obtained by adding signals that have been biased by constant-voltage source E32 and output signals of amplifier A33 are applied at the gate of field effect transistor Q32 when the amount of current flowing between the source and the drain of field effect transistor Q31 is a predetermined value or less. In short, if the amount of current flowing between the source and the drain of field effect transistor Q31 is a predetermined value or less, the high-frequency component of signals input to the gate of field effect transistor Q32 is amplified in comparison to when the amount of current is greater than a predetermined value. The amplification factor of push-pull amplifier 300 is thereby compensated.

By means of the first and second embodiments, signals applied to the gate of a field effect transistor are manipulated in order to compensate the amplification factor. Embodiments whereby the amplification factor is compensated by directly supplementing output signals will be described next.

Figure 4:
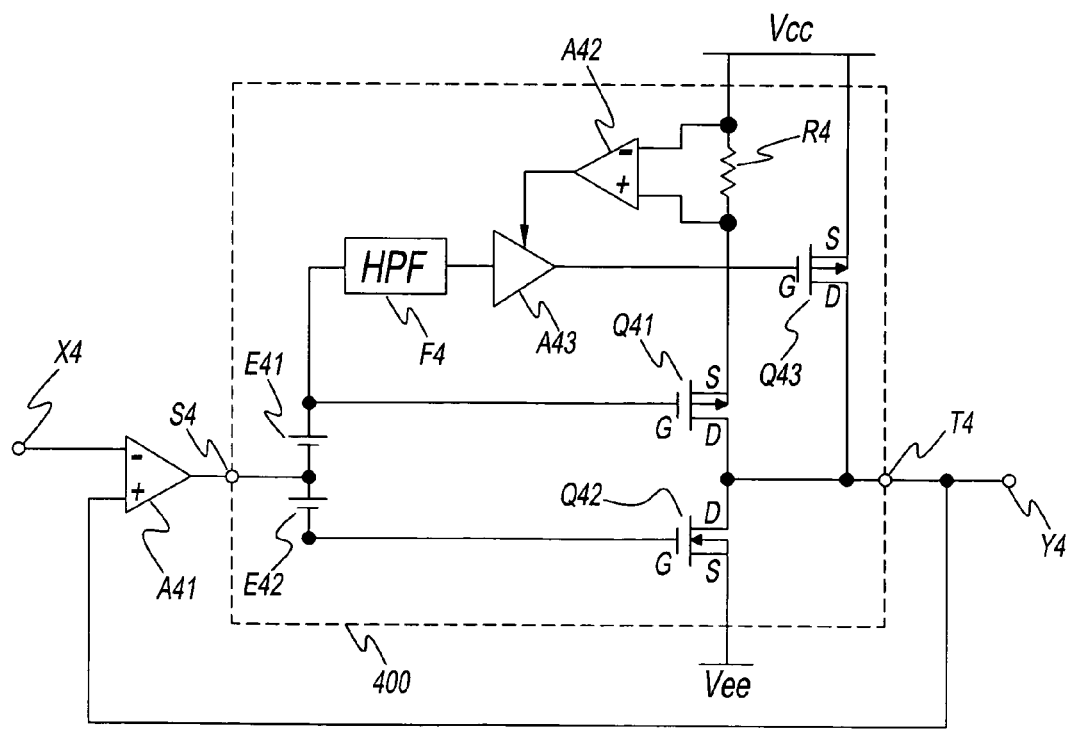
FIG. 4 is a drawing showing a power amplifying apparatus 40 comprising a push-pull amplifier 400 of the present invention.

The third embodiment of the present invention is a power amplifying apparatus 40 shown in FIG. 4.

Power amplifying apparatus 40 in the figure comprises an input terminal X4, an output terminal Y4, an operational amplifier A41, and a push-pull amplifier 400. Signals at input terminal X4 and signals at output terminal Y4 are applied to operational amplifier A41. Operational amplifier A41 inputs to push-pull amplifier 400 signals such that the difference between two signals to be input is zero. Push-pull amplifier 400 power-amplifies input signals and outputs the amplified signal to output terminal Y4.

Push-pull amplifier 400 is a bipolar push-pull amplifier that uses an MOS field effect transistor. Push-pull amplifier 400 comprises an input terminal S4, an output terminal T4, a push-side P channel MOS field effect transistor Q41, a pull-side N channel MOS field effect transistor Q42, a constant-voltage source E41, and a constant-voltage source E42. The drain of field effect transistor Q41 and the drain of field effect transistor Q42 are connected to output terminal T4. The source of field effect transistor Q41 is connected to a positive power source Vcc. The source of field effect transistor Q42 is connected to a negative power source Vee. Signals received at input terminal S4, that is, output signals of operational amplifier A41, are biased by constant-voltage source E41 and input to the gate of field effect transistor Q41. Moreover, signals received at input terminal S4 are biased by constant-voltage source E42 and input to the gate of field effect transistor Q42. The pair of field effect transistors Q41 and Q42 operates as a class A, class AB, or class B amplifier in accordance with the voltage of constant-voltage sources E41 and E42. The structure described above is the basic part of push-pull amplifier 400.

Furthermore, push-pull amplifier 400 comprises resistor R4 and operational amplifier A42. Resistor R4 is disposed between the source of field effect transistor Q41 and positive power source Vcc. Operational amplifier A42 detects the potential difference between the two terminals of resistor R4 and outputs signals that represent the amount of current flowing between the source and the drain of field effect transistor Q41.

Push-pull amplifier 400 comprises a high-pass filter F4, an amplifier A43, and a boost transistor Q43. Boost transistor Q43 is a P channel MOS field effect transistor. High-pass filter F4 extracts the high-frequency component of signals received at input terminal S4 and outputs the filtered signal to amplifier A43. The cut-off frequency of high-pass filter F4 is set such that it includes the band that should be compensated. Amplifier A43 amplifies input signals by a predetermined amplitude and then outputs the amplified signal. The output signals of amplifier A43 are applied to the gate of boost transistor Q43. The source of boost transistor Q43 is connected to positive power source Vcc. The drain of boost transistor Q43 is connected to output terminal T4. Amplifier A43 operates in accordance with output signals of operational amplifier A42. In further detail, amplifier A43 amplifies input signals and outputs the amplified signal when the amount of current flowing between the source and the drain of field effect transistor Q41 is a predetermined value or less. Boost transistor Q43 is turned on by signals input to the gate at that time. On the other hand, amplifier A43 outputs signals such that boost transistor Q43 is turned off when the amount of current flowing between the source and the drain of field effect transistor Q41 is greater than a predetermined value. In addition, amplifier A43 outputs signals such that boost transistor Q43 is turned off when the amount of current flowing between the source and the drain of field effect transistor Q41 is zero, that is, when field effect transistor Q41 is off.

Consequently, boost transistor Q43 amplifies only the high-frequency component extracted from signals received at input terminal S4 and outputs the amplified signal to output terminal T4 only when the amount of current flowing between the source and the drain of field effect ransistor Q41 is within a predetermined range. The amplification factor of push-pull amplifier 400 is thereby compensated.

Figure 5:
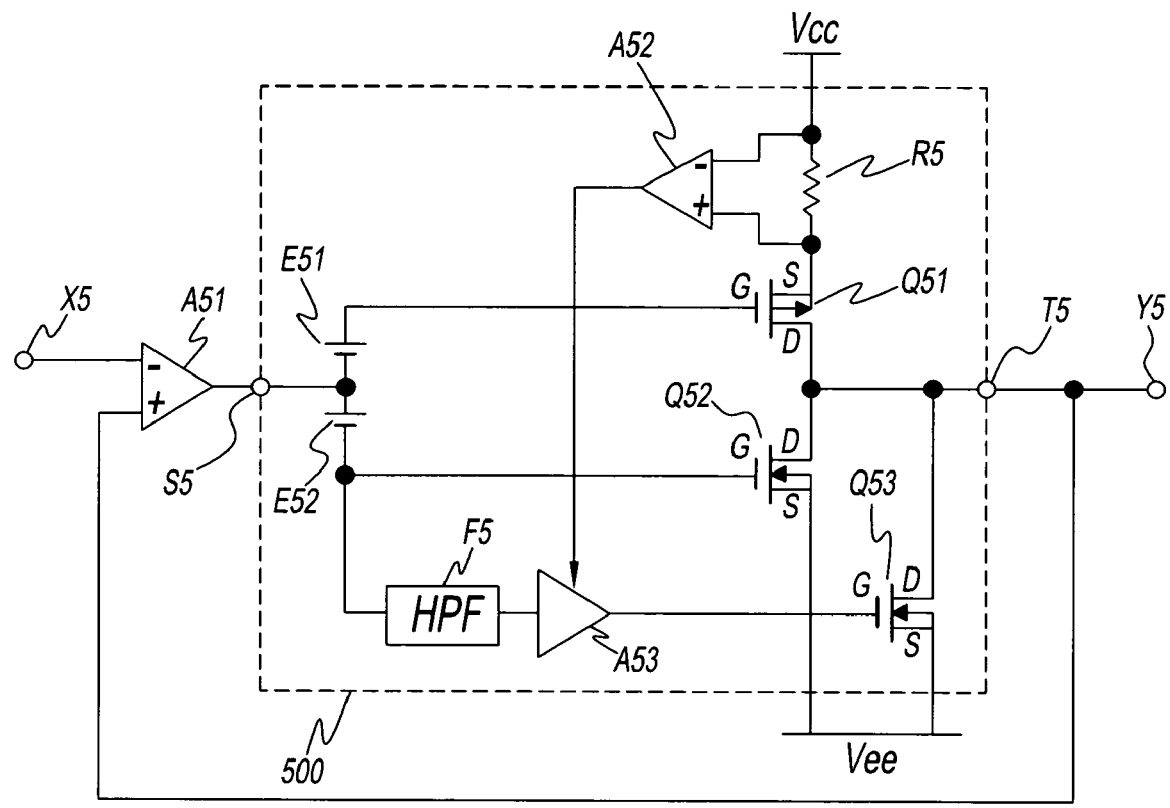
FIG. 5 is a drawing showing a power amplifying apparatus 50 comprising a push-pull amplifier 500 of the present invention.

A fourth embodiment of the present invention is a power amplifying apparatus 50 shown in FIG. 5.

Power amplifying apparatus 50 in the figure comprises an input terminal X5, an output terminal Y5, an operational amplifier A51, and a push-pull amplifier 500. Signals at input terminal X5 and signals at output terminal Y5 are applied to operational amplifier A51. Operational amplifier A51 inputs to push-pull amplifier 500 signals such that the difference between two signals to be input is zero. Push-pull amplifier 500 power-amplifies input signals and outputs the amplified signal to output terminal Y5.

Push-pull amplifier 500 is a bipolar push-pull amplifier that uses an MOS field effect transistor. Push-pull amplifier 500 comprises an input terminal S5, an output terminal T5, a push-side P channel MOS field effect transistor Q51, a pull-side N channel MOS field effect transistor Q52, a constant-voltage source E51, and a constant-voltage source E52. The drain of field effect transistor Q51 and the drain of field effect transistor Q52 are connected to output terminal T5. The source of field effect transistor Q51 is connected to a positive power source Vcc. The source of field effect transistor Q52 is connected to a negative power source Vee. Signals received at input terminal S5, that is, output signals of operational amplifier A51, are biased by constant-voltage source E51 and input to the gate of field effect transistor Q51. Moreover, signals received at input terminal S5 are biased by constant-voltage source E52 and input to the gate of field effect transistor Q52. The pair of field effect transistors Q51 and Q52 operates as a class A, class AB, or class B amplifier in accordance with the voltage of constant-voltage sources E51 and E52. The structure described above is the basic part of push-pull amplifier 500.

Furthermore, push-pull amplifier 500 comprises a resistor R5 and operational amplifier A52. Resistor R5 is disposed between the source of field effect transistor Q51 and positive power source Vcc. Operational amplifier A52 detects the potential difference between the two terminals of resistor R5 and outputs signals that represent the amount of current flowing between the source and the drain of field effect transistor Q51.

Push-pull amplifier 500 comprises a high-pass filter F5, an amplifier A53, and a boost transistor Q53. Boost transistor Q53 is an N channel MOS field effect transistor. High-pass filter F5 extracts the high-frequency component of signals received at input terminal S5 and outputs the filtered signal to amplifier A53. The cut-off frequency of high-pass filter F5 is set such that it includes the band that should be compensated. Amplifier A53 amplifies the input signals by a predetermined amplitude and then outputs the product. The output signals of amplifier A53 are applied to the gate of boost transistor Q53. The source of boost transistor Q53 is connected to negative power source Vee. The drain of boost transistor Q53 is connected to output terminal T5. Amplifier A53 operates in accordance with output signals of operational amplifier A52. In further detail, amplifier A53 amplifies the input signals and outputs amplified signal when the amount of current flowing between the source and the drain of field effect transistor Q51 is a predetermined value or less. Boost transistor Q53 is turned on by signals input to the gate contemporaneously. On the other hand, amplifier A53 outputs signals such that boost transistor Q53 is turned off when the amount of current flowing between the source and the drain of field effect transistor Q51 is greater than a predetermined value. In addition, amplifier A53 outputs signals such that boost transistor Q53 is turned off when the amount of current flowing between the source and the drain of field effect transistor Q51 is zero, that is, when field effect transistor Q51 is off.

Consequently, boost transistor Q53 amplifies only the high-frequency component extracted from signals received at input terminal S5 and outputs the amplified signal to output terminal T5 only when the amount of current flowing between the source and the drain of field effect transistor Q51 is within a predetermined range. The amplification factor of push-pull amplifier 500 is thereby compensated.

Figure 6:
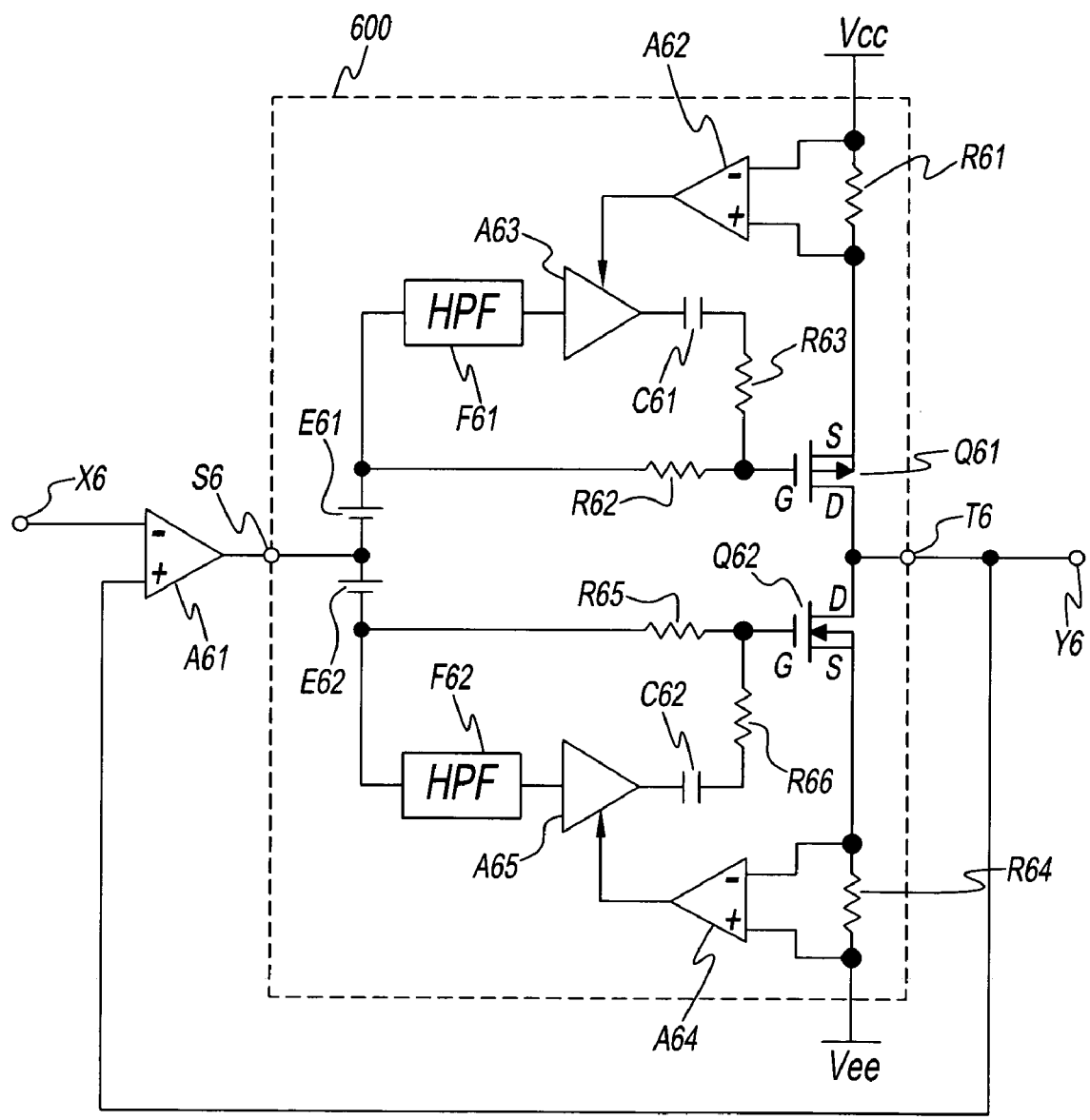
FIG. 6 is a drawing showing a power amplifying apparatus 60 comprising a push-pull amplifier 600 of the present invention.

The above-mentioned embodiments compensate for the reduction in the amplification factor attributed to the transistor on the push side. A detection means for the drain current and a circuit segment that operates in response to this means can be disposed for the pull side in order to compensate for a reduction in the amplification factor attributed to the transistor on the pull side. A power amplifying apparatus 60 having this type of push-pull amplifier is described below as a fifth embodiment of the present invention while referring to FIG. 6. The fifth embodiment expands on the first embodiment.

Power amplifying apparatus 60 in the figure comprises an input terminal X6, an output terminal Y6, an operational amplifier A61, and a push-pull amplifier 600. Signals at input terminal X6 and Signals at output terminal Y6 are applied to operational amplifier A61. Operational amplifier A61 inputs to push-pull amplifier 600 signals such that the difference between two signals to be input is zero. Push-pull amplifier 600 power-amplifies input signals and outputs the amplified signal to output terminal Y6.

Push-pull amplifier 600 is a bipolar push-pull amplifier that uses an MOS field effect transistor. Push-pull amplifier 600 comprises an input terminal S6, an output terminal T6, a push-side P channel MOS field effect transistor Q61, a pull-side N channel MOS field effect transistor Q62, a constant-voltage source E61, and a constant-voltage source E62. The drain of field effect transistor Q61 and the drain of field effect transistor Q62 are connected to output terminal T6. The source of field effect transistor Q61 is connected to a positive power source Vcc. The source of field effect transistor Q62 is connected to a negative power source Vee. The signals received at input terminal S6, that is, the output signals of operational amplifier A61, are biased by constant-voltage source E61 and input to the gate of field effect transistor Q61. Moreover, the signals received at input terminal S6 are biased by constant-voltage source E62 and input to the gate of field effect transistor Q62. The pair of field effect transistors Q61 and Q62 operates as a class A, class AB, or class B amplifier in accordance with the voltage of constant-voltage sources E61 and E62. The structure described above is the basic part of push-pull amplifier 600.

Furthermore, push-pull amplifier 600 comprises a resistor R61 and an operational amplifier A62. Resistor R61 is disposed between the source of field effect transistor Q61 and positive power source Vcc. Operational amplifier A62 detects the potential difference between the two terminals of resistor R61 and outputs signals that represent the amount of current flowing between the source and the drain of field effect transistor Q61.

Push-pull amplifier 600 comprises a high-pass filter F61, an amplifier A63, a capacitor C61, a resistor R62, and a resistor R63. High-pass filter 61 extracts the high-frequency component of signals received at input terminal S6 and outputs the filtered signal to amplifier A63. The cut-off frequency of high-pass filter F61 is set such that it includes the band that should be compensated. Amplifier A63 amplifies input signals by a predetermined amplitude and then outputs the product. Amplifier A63 operates in accordance with the output signals of operational amplifier A62. In further detail, amplifier A63 outputs signals only when the amount of current flowing between the source and the drain of field effect transistor Q61 is a predetermined value or less. Capacitor C61 is used in order to obtain the alternating current component from the output signals of amplifier A63. Resistors R62 and R63 operate as a signal adding means.

Moreover, push-pull amplifier 600 comprises a resistor R64 and an operational amplifier A64. Resistor R64 is disposed between the source of field effect transistor Q62 and negative power source Vee. Operational amplifier A64 detects the potential difference between the two terminals of resistor R64 and outputs signals that represent the amount of current flowing between the source and drain of field effect transistor Q62.

Push-pull amplifier 600 further comprises a high-pass filter F62, an amplifier A65, a capacitor C62, a resistor R65, and a resistor R66. High-pass filter F62 extracts the high-frequency component of the signals received at input terminal S6 and outputs filtered signal to amplifier A65. The cut-off frequency of high-pass filter F62 is set such that it includes the band that should be compensated. Amplifier A65 amplifies input signals by a predetermined amplitude and then outputs the amplified signal. Amplifier A65 operates in accordance with the output signals of operational amplifier A64. In further detail, amplifier A65 outputs signals only when the amount of current flowing between the source and the drain of field effect transistor Q62 is a predetermined value or less. Capacitor C62 is used in order to obtain the alternating current component from the output signals of amplifier A65. Resistors R65 and R66 operate as a signal adding means.

If the amount of current flowing between the source and the drain of field effect transistor Q61 of power amplifying apparatus 60 that is constructed as described above is a predetermined current or less, the high-frequency component of signals input to the gate of field effect transistor Q61 is amplified in comparison with the case when this amount of current is greater than the predetermined current. If the amount of current flowing between the source and the drain of field effect transistor Q62 is a pre-determined current or less, the high-frequency component of signals input to the gate of field effect transistor Q62 is amplified in comparison to the case when this current is greater than a predetermined current. The amplification factor of push-pull amplifier 600 is thereby compensated. This compensation is performed from both the push side and the pull side.

The following modifications are possible in each of the above-mentioned embodiments.

First, although the field effect transistors are connected such that a drain output-type of push-pull amplifier is formed in each of the above-mentioned embodiments, the field effect transistors can be connected such that a source follower-type of push-pull amplifier is formed.

Moreover, the field effect transistors in each of the above-mentioned embodiments can be replaced by bipolar transistors and other unipolar transistors. All or some of the field effect transistors can be replaced. Field effect transistors Q43 and Q53 can also be replaced with active elements. For instance, at least one of field effect transistors Q22 and Q23 in FIG. 2 can be replaced with bipolar transistors. Moreover, field effect transistor Q32 in FIG. 3 can be replaced with active elements other than transistors.

What is claimed is:

1. A push-pull amplifier comprising a pair of transistors, wherein each of the transistors includes a control terminal, a first terminal, and a second terminal, and wherein a current that flows between the first terminal and the second terminal is controlled in accordance with signals applied to the control terminal, such that when an amount of current flowing between the first terminal and the second terminal of one of the transistors is within a predetermined range, a high-frequency component of the signals input to the control terminal of one of the transistors is amplified, and when this current is outside the predetermined range, the high frequency component is not amplified.

2. The push-pull amplifier according to claim 1, further comprising:
   a detector that detects the current that flows between the first and second terminals of one of the transistors; and
   a filter that extracts the high-frequency component from an input signal and outputs the high-frequency component only when the current detected by the detector is within the predetermined range.

3. The push-pull amplifier according to claim 2, wherein said filter has a signal amplifier.

4. A push-pull amplifier comprising:
   an input terminal;
   an output terminal;
   a pair of transistors, wherein the pair of transistors amplifies signals received at said input terminal, and output to said output terminal, wherein each of the transistors includes a control terminal, a first terminal, and a second terminal that controls a current flowing between the first terminal and the second terminal in accordance with signals applied to the control terminal; and
   an amplifier for amplifying only a high-frequency component extracted from said signals received at said input terminal, and outputting said amplified signal to said output terminal when an amount of current flowing between the first and second terminals of one of the transistors is within a predetermined range, wherein the amplifier is turned off when the amount of current flowing is outside the predetermined range.

5. The push-pull amplifier according to claim 4, wherein said amplifier comprises:
   a detector which detects the current flowing between the first and second terminals of one of the transistors;
   a filter which extracts and outputs the high-frequency component from signals received at the input terminal only when the current detected by the detector is within the predetermined range; and
   a transistor that is disposed parallel to one of the transistors and operates in response to the output signals of the filter.

6. The push-pull amplifier according to claim 5, wherein said filter has a signal amplifier.

7. A power amplifying apparatus comprising: a push-pull amplifier having a pair of transistors, wherein each of the transistors has a control terminal, a first terminal, and a second terminal, and wherein a current that flows between the first terminal and the second terminal is controlled in accordance with signals applied to the control terminal, such that when an amount of current flowing between the first terminal and the second terminal of one of the transistors is within a predetermined range, a high-frequency component of signals input to the control terminal of one of the transistors is amplified, and when this current is outside the predetermined range, the high-frequency component is not amplified.

8. A power amplifying apparatus comprising:
   a push-pull amplifier having:
      an input terminal;
      an output terminal; and
      a pair of transistors, wherein the pair of transistors amplifies signals received at said input terminal and output to said output terminal, wherein each of the transistors includes a first terminal, and a second terminal, and a control terminal that controls a current flowing between the first terminal and the second terminal in accordance with signals applied to the control terminal; and
      an amplifier for amplifying only a high-frequency component extracted from said signals received at said input terminal and outputting an amplified signal to said output terminal when an amount of current flowing between the first and second terminals of one of the transistors is within a predetermined range, wherein the amplifier is turned off when the amount of current flowing is outside the predetermined range.

* * * * *